(12) United States Patent  (10) Patent No.: US 7,744,394 B1
Sun  (45) Date of Patent: Jun. 29, 2010

(54) GOLDEN FINGER PROTECTING DEVICE

(75) Inventor: Zheng-Heng Sun, Taipei Hsien (TW)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 12/436,761

(22) Filed: May 6, 2009

(51) Int. Cl.
  *H01R 13/62* (2006.01)
  *H01R 11/22* (2006.01)
(52) U.S. Cl. .................... 439/267; 439/367
(58) Field of Classification Search ............ 361/751
  See application file for complete search history.

(56) References Cited

U.S. PATENT DOCUMENTS

| 4,740,169 | A | * | 4/1988 | Gordon | ............... | 439/148 |
| 6,908,038 | B1 | * | 6/2005 | Le | ............... | 235/492 |
| 6,942,512 | B1 | * | 9/2005 | Yoon et al. | ............... | 439/267 |
| 2005/0287874 | A1 | * | 12/2005 | Cheng et al. | ............... | 439/746 |
| 2009/0294792 | A1 | * | 12/2009 | Lee et al. | ............... | 257/99 |

* cited by examiner

*Primary Examiner*—Chandrika Prasad
(74) *Attorney, Agent, or Firm*—Zhigang Ma

(57) ABSTRACT

A golden finger protecting device includes a first, a second, and a third sidewall is connected between corresponding sides of the first and second walls. The first, the second, and third sidewalls are formed by folding a substrate along two parallel fold lines, to wrap the connection terminal of the expansion card. A width of the third sidewall is equal to thickness of the connection terminal. Widths of the first and second sidewalls are respectively greater than or equal to width of the connection terminal. A handle extends from the first sidewall or the second sidewall, away from the third sidewall. A first hole is defined symmetrically extending through the first and second sidewalls and extending through the third sidewall. At least one second hole is defined between a side opposite to the third sidewall of the first or second sidewall and a corresponding end of the first hole.

9 Claims, 6 Drawing Sheets

GOLDEN FINGER PROTECTING DEVICE

BACKGROUND

1. Technical Field

The present disclosure relates to a golden finger protecting device.

2. Description of Related Art

Generally speaking, some expansion cards, such as display cards, sound cards, etc. are connected to a motherboard of a computer via golden fingers of the expansion cards. Some expansion cards are mounted on the motherboard of the computer before the computer system is shipped. The expansion cards may experience vibration or impact during shipment, which brings attrition between the golden fingers of the expansion cards and the pins of sockets of the motherboard. The attrition may cause the golden fingers to be damaged, or at least have poor contact between the expansion cards and the sockets.

DETAILED DESCRIPTION

Figure 1:
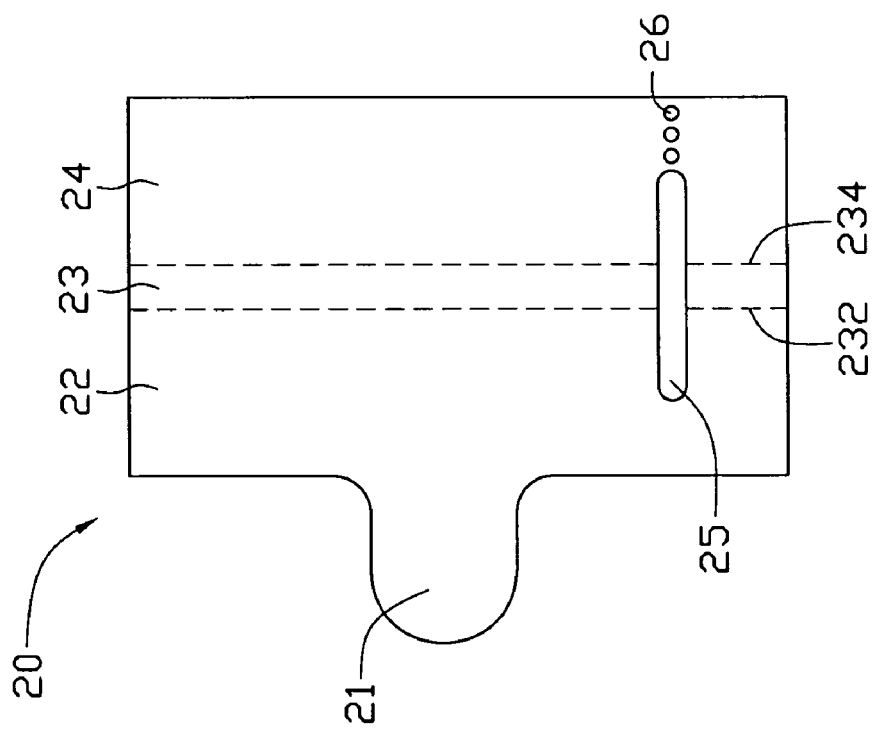
FIG. 1 is a schematic diagram of a first embodiment of a golden finger protecting device.
Figure 2:
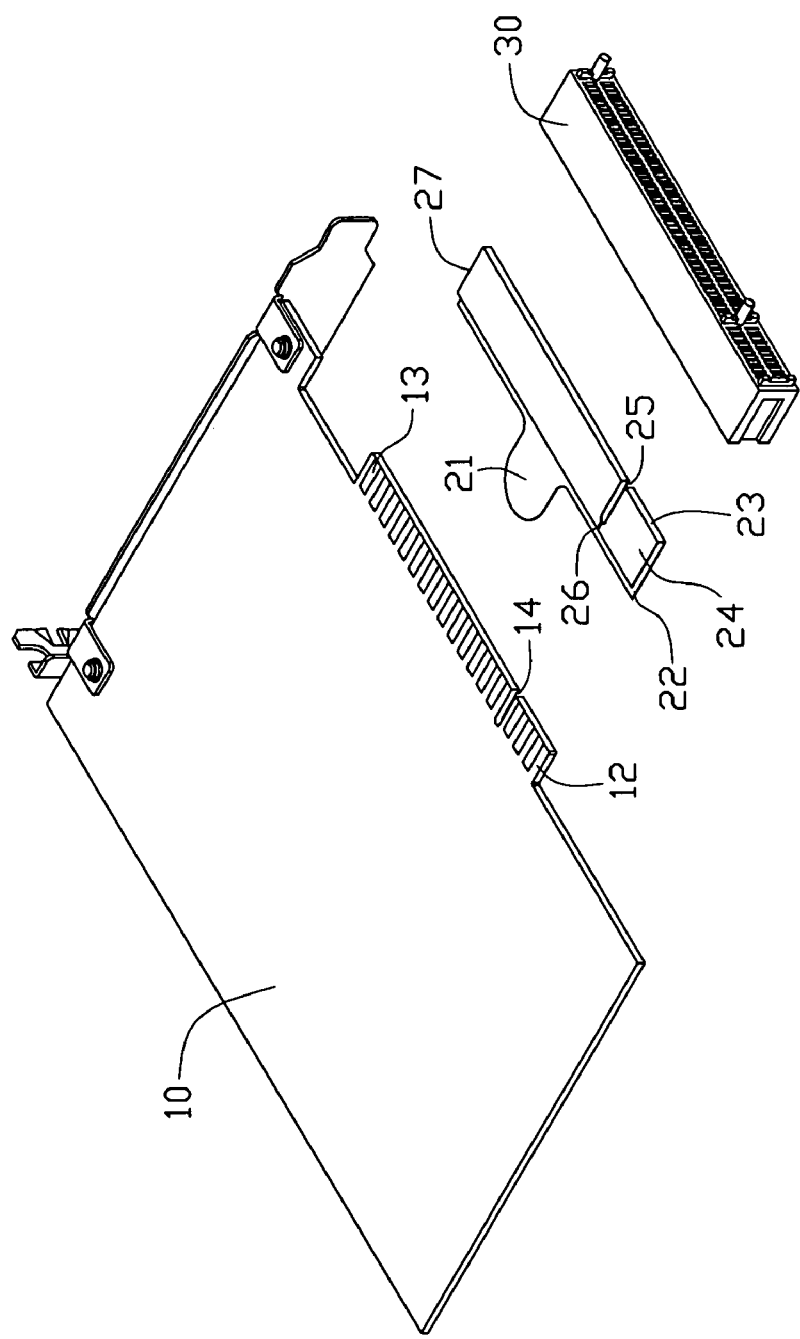
FIG. 2 is an exploded, isometric view of the golden finger protecting device of FIG. 1, an expansion card, and an expansion socket of a motherboard.
Figure 3:
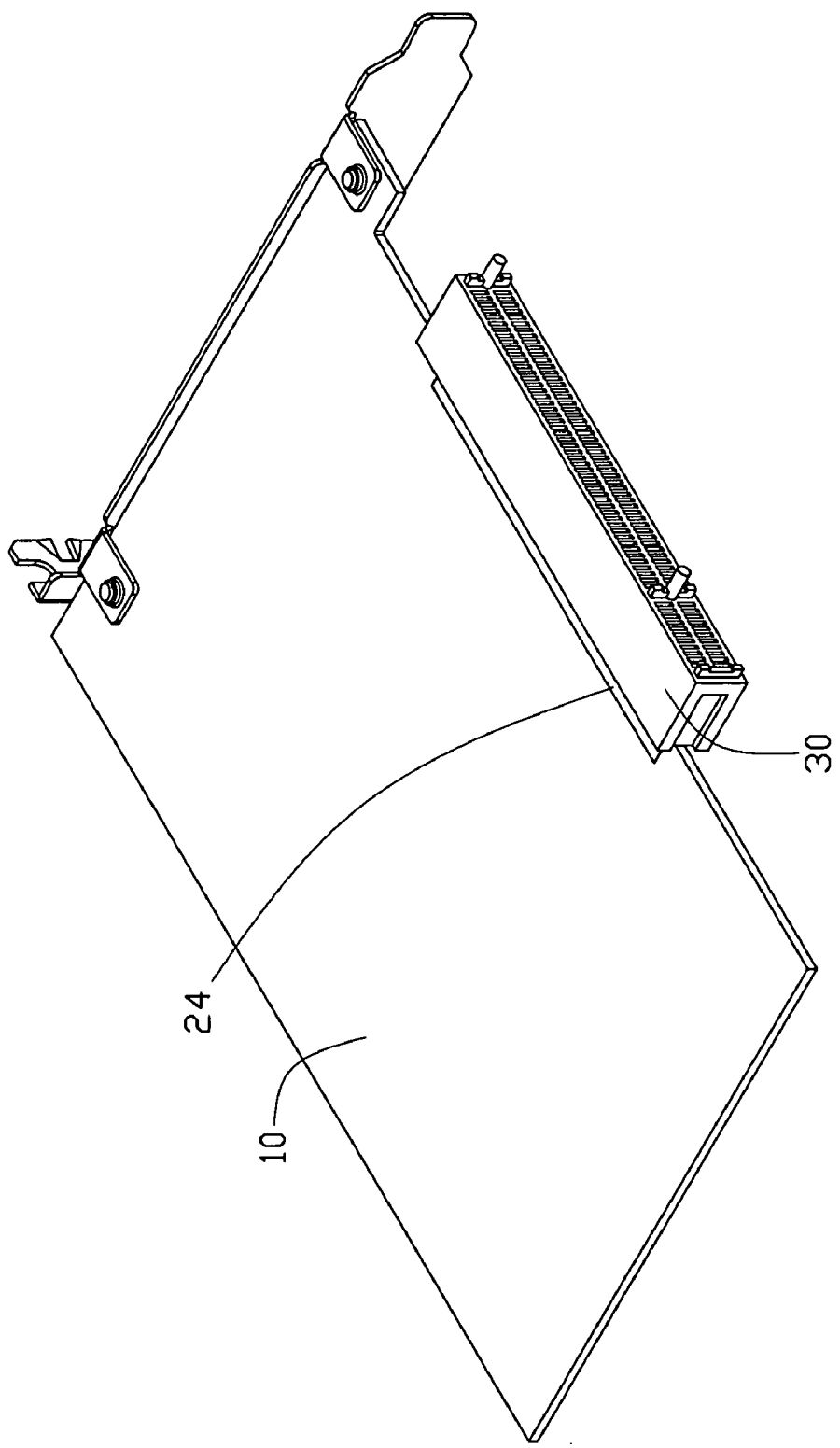
FIG. 3 is an assembled view of FIG. 2.

Referring to FIGS. 1 to 3, a first exemplary embodiment of a golden finger protecting device 20 is configured to be mounted to a connection terminal 12 having a plurality of golden fingers 13 of an expansion card 10 for protecting the golden fingers 13. The golden finger protecting device 20 includes a substantially U-shaped body 27. The body 27 is made of insulating ultrathin wearable material, such as plastic. The body 27 includes a bottom wall 22, a top wall 24 parallel to the bottom wall 22, and a sidewall 23 perpendicularly connected to corresponding sides of the bottom and top walls 22, 24. The bottom wall 22, sidewall 23, and top wall 24 are formed by folding the body 27 along two parallel fold lines 232, 234. A width of the sidewall 23 is equal to a thickness of the connection terminal 12 of the expansion card 10. Widths of the bottom wall 22 and the top wall 24 are respectively greater than or equal to a width of the connection terminal 12 of the expansion card 10. A handle 21 extends from a side opposite to the sidewall 23 of the bottom wall 22. A strip-shape hole 25 parallel to the plurality of golden fingers 13 is defined in the body 27, symmetrically extending through the bottom wall 22, the sidewall 23, and the top wall 24, and corresponding to a notch 14 that is defined in the connection terminal 12 parallel to the plurality of golden fingers 13 of the expansion card 10. A plurality of circular holes 26 is defined in the top wall 24 between a side opposite to the sidewall 23 of the top wall 24 and an end of the hole 25. In other embodiments, the shape of the hole 25 can be changed according to the shape of the notch 14 of the connection terminal 12. The shape and the number of the circular holes 26 can be changed according to need.

Referring to FIGS. 2 and 3, in use, the connection terminal 12 of the expansion card 10 is received between the bottom wall 22 and the top wall 24 of the body 27. The sidewall 23 is attached to a lateral surface of the connection terminal 12 of the expansion card 10. The notch 14 of the connection terminal 12 of the expansion card 10 is exposed through the hole 25. The connection terminal 12 wrapped with the golden finger protecting device 20 of the expansion card 10 is plugged into a corresponding expansion socket 30 of a motherboard. The protecting device 20 can prevent attrition to the plurality of golden fingers of the expansion card 10 and the expansion socket 30.

Before the motherboard having the expansion socket 30 engaged with the expansion card 10 is powered, the handles 21 is pulled, causing the holes 26 of the protecting device 20 to be torn against a positioning block (not shown) of the expansion socket 30, causing the body 27 to spread. Therefore, the body 27 can be removed from the expansion socket 30.

Figure 4:
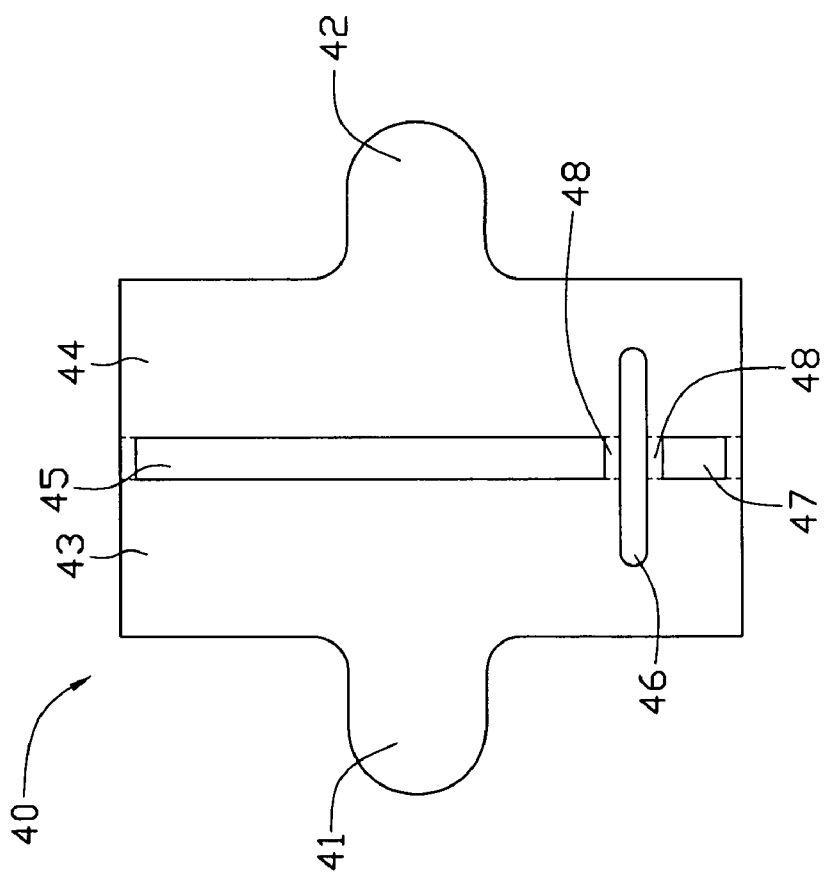
FIG. 4 is a schematic diagram of a second embodiment of a golden finger protecting device.
Figure 5:
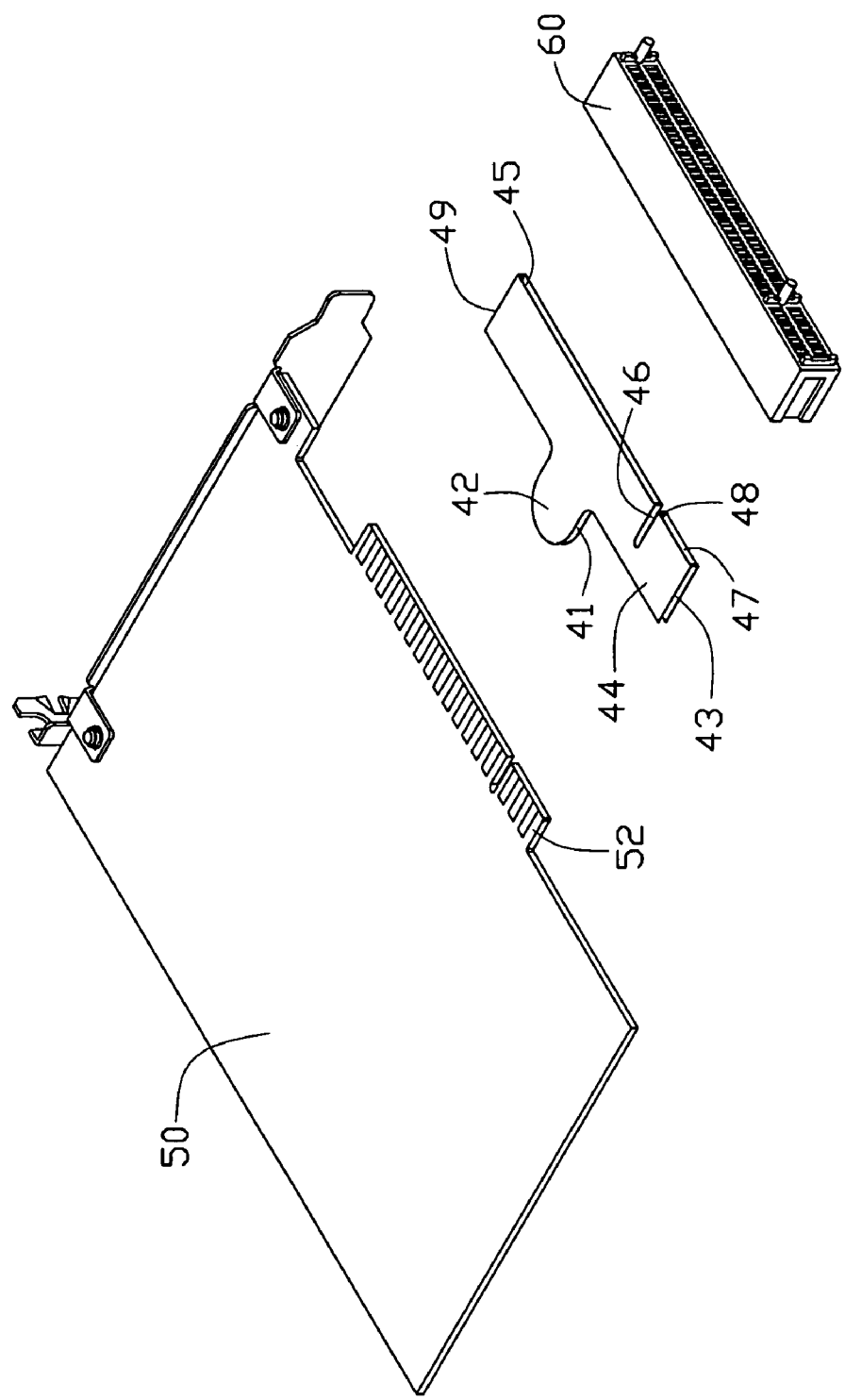
FIG. 5 is an exploded, isometric view of the golden finger protecting device of FIG. 4, an expansion card, and an expansion socket of a motherboard.
Figure 6:
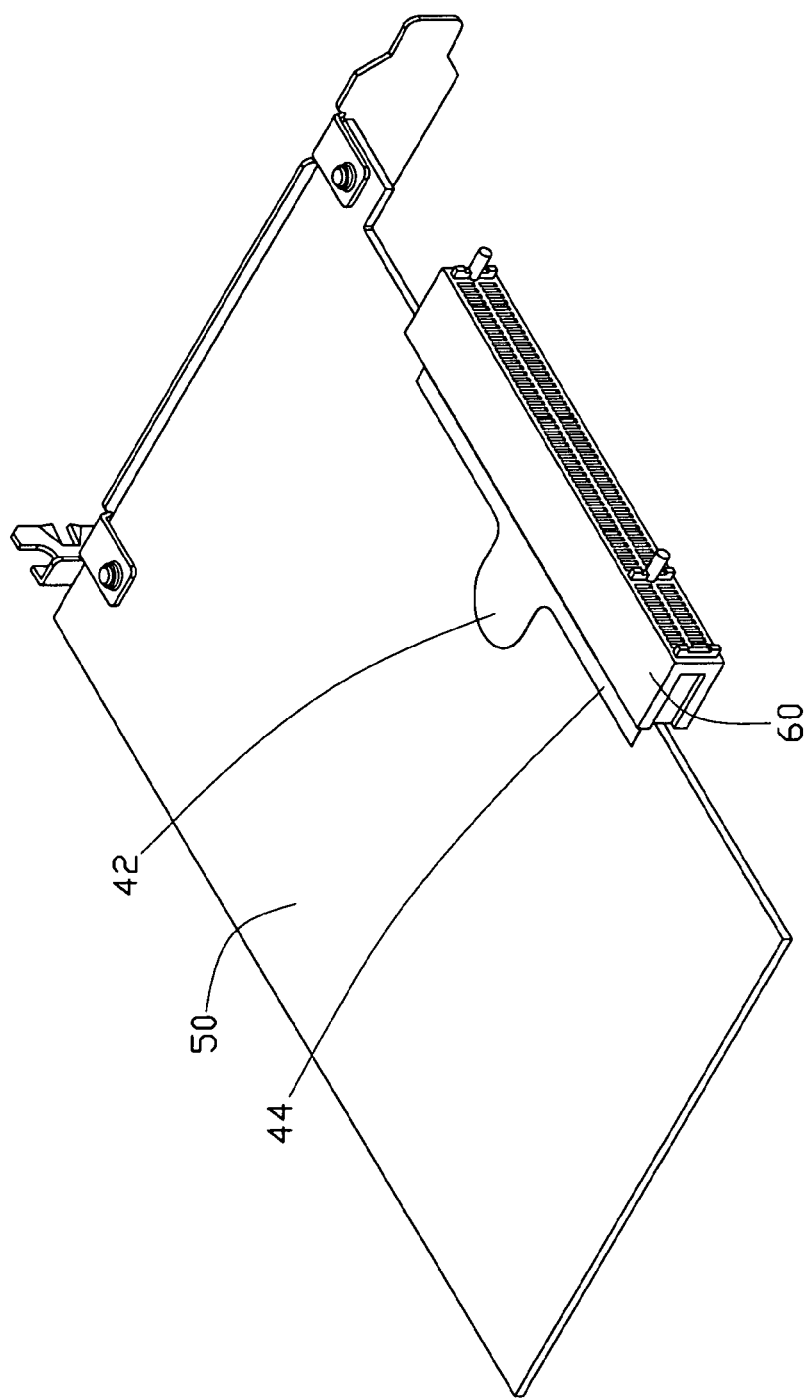
FIG. 6 is an assembled view of FIG. 5.

Referring to FIGS. 4 to 6, a second exemplary embodiment of a golden finger protecting device 40 is to be mounted to a connection terminal 52 of an expansion card 50 for protecting a plurality of golden fingers of the expansion card 50. The golden finger protecting device 40 is substantially similar to the golden finger protecting device 20 of the first embodiment. Differences of the golden finger protecting device 40 from the golden finger protecting device 20 are that two handles 41, 42 respectively extend from a bottom wall 43 and a top wall 44 of a body 49 of the golden finger protecting device 40, and two through holes 45, 47, generally strip-shaped, are defined in a sidewall 48 of the golden finger protecting device 40 and located at opposite sides of a square hole 46 of the golden finger protecting device 40. A width of each of the through holes 45, 47 is equal to a thickness of the connection terminal 52 of the expansion card 50.

In use, when the motherboard having the expansion socket 60 engaged with the expansion card 50 is powered, the handles 41, 42 are pulled, causing the sidewall 48 to be torn against a positioning block (not shown) of the expansion socket 60, causing the body 49 to spread. Therefore, the body 49 can be removed from the expansion socket 60.

The golden finger protecting device is wrapped about the expansion card which is plugged into a corresponding expansion socket of a motherboard, thereby preventing attrition to the golden fingers of the expansion card and the expansion socket. Before the motherboard is powered, the golden finger protecting device can be removed from the expansion socket. Therefore, the expansion card can work normally after the golden finger protecting device is removed from the expansion socket.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching. The embodiments were chosen and described in order to explain the principles of the disclosure and their practical application so as to enable others skilled in the art to utilize the disclosure and various embodiments and with various modifications as are suited to the particular use contemplated. Alternately embodiments will become apparent to those skilled in the art to which the present disclosure pertains without departing from its spirit and scope. Accordingly, the scope of the present disclosure is defined by the appended claims rather than the foregoing description and the exemplary embodiments described therein.

What is claimed is:

1. A golden finger protecting device mountable to a connection terminal of an expansion card for protecting golden fingers of the connection terminal, the golden finger protecting device comprising:
- a first sidewall;
- a second sidewall parallel to the first sidewall;
- a third sidewall connected between corresponding sides of the first and second walls, wherein the first, the second, and third sidewalls are formed by folding a substrate along two parallel fold lines, to wrap the connection terminal of the expansion card, wherein a width of the third sidewall is equal to a thickness of the connection terminal, widths of the first and second sidewalls are respectively greater than or equal to a width of the connection terminal; and
- a handle extending from the first sidewall or the second sidewall, away from the third sidewall;
- wherein the golden finger protecting device defines a first hole symmetrical extending through the first and second sidewalls and extending through the third sidewall; and the sidewall of the first or second sidewall without the handle defines at least one second hole between a side opposite to the third sidewall of the first or second sidewall and a corresponding end of the first hole; and
- wherein the golden finger protecting device is pluggable into a corresponding expansion socket in response to the expansion card is engaged with an expansion socket, with the handle extending out of the expansion socket, sidewalls bounding the at least one second hole are to be torn to spread the golden finger protecting device in response to the handle is driven, to remove the golden finger protecting device from the expansion socket.

2. The golden finger protecting device of claim 1, wherein the golden finger protecting device is substantially U-shaped, the first hole is a strip-shaped hole, and the shape of the first hole is corresponding to the shape of a notch of the connection terminal of the expansion card, each of the at least one second hole is a circular hole.

3. The golden finger protecting device of claim 1, wherein the first to third sidewalls are made of insulating ultrathin wearable material.

4. The golden finger protecting device of claim 3, wherein the first to third sidewalls are made of plastic.

5. The golden finger protecting device of claim 1, wherein the at least one second hole comprises three second holes.

6. A golden finger protecting device to be mounted to a connection terminal of an expansion card for protecting golden fingers of the expansion card, the golden finger protecting device comprising:
- a body comprising:
  - a first sidewall;
  - a second sidewall parallel to the first sidewall to sandwich the connection terminal, together with the first sidewall;
  - a third sidewall perpendicularly connected between corresponding sides of the first and second sidewalls, wherein the first to third sidewalls of the body are formed by folding a substrate along two parallel fold lines, widths of the first sidewall and the second sidewall are respectively greater than or equal to a width of the connection terminal, wherein the third sidewall lineably defines two first holes, a width of each first hole is equal to a thickness of the connection terminal; and
- two handles extending from sides of the first and second sidewalls, respectively, opposite to the third sidewall;
- wherein the body defines a second hole symmetrical extending through the first sidewall and the second sidewall, and extending through the third sidewall between the first holes; and
- wherein the body is to wrap the connection terminal of the expansion card, and to be plugged into a corresponding expansion socket with the connection terminal, the third sidewall is to be torn by the expansion socket when the handles are driven away from the expansion socket, to spread the body, thereby to remove the body from the expansion socket.

7. The golden finger protecting device of claim 6, wherein the two first holes and the second hole are strip-shaped holes, the shape of the second hole is corresponding to a shape of a notch of the connection terminal of the expansion card.

8. The golden finger protecting device of claim 6, wherein the body is made of insulating ultrathin wearable material.

9. The golden finger protecting device of claim 8, wherein the body is made of plastic.

* * * * *